(12) United States Patent
Aiso (10) Patent No.: US 7,906,809 B2
(45) Date of Patent: Mar. 15, 2011

(54) SEMICONDUCTOR DEVICE HAVING AN ELEVATED SOURCE/DRAIN STRUCTURE OF VARYING CROSS-SECTION

(75) Inventor: Fumiki Aiso, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 12 days.

(21) Appl. No.: 12/272,036

(22) Filed: Nov. 17, 2008

(65) Prior Publication Data

US 2009/0072324 A1    Mar. 19, 2009

Related U.S. Application Data

(62) Division of application No. 11/410,118, filed on Apr. 25, 2006, now Pat. No. 7,482,235.

(30) Foreign Application Priority Data

Apr. 25, 2005   (JP) ................................ 2005-125921

(51) Int. Cl.
    *H01L 29/78*    (2006.01)
(52) U.S. Cl. .................. 257/330; 257/332; 257/E29.267
(58) Field of Classification Search .................. 438/300; 257/288, 330–332, E21.43, E29.267
    See application file for complete search history.

(56) References Cited

U.S. PATENT DOCUMENTS

| | | | |
|---|---|---|---|
| 4,404,732 A | 9/1983 | Andrade | |
| 5,182,619 A | 1/1993 | Pfiester | |
| 5,371,026 A * | 12/1994 | Hayden et al. | 438/275 |
| 5,753,555 A | 5/1998 | Hada | |
| 6,137,149 A | 10/2000 | Kodama | |
| 6,228,728 B1 * | 5/2001 | Furukawa et al. | 438/300 |
| 7,253,086 B2 | 8/2007 | Hall | |
| 2001/0023108 A1 | 9/2001 | Miyano et al. | |
| 2004/0161884 A1 * | 8/2004 | Lee et al. | 438/197 |
| 2004/0197969 A1 | 10/2004 | Chen et al. | |
| 2004/0262650 A1 | 12/2004 | Iwata et al. | |
| 2006/0088966 A1 | 4/2006 | Tsai et al. | |

FOREIGN PATENT DOCUMENTS

| | | |
|---|---|---|
| JP | 08-167718 | 6/1996 |
| JP | 10-107219 | 4/1998 |
| JP | 2000-049348 | 2/2000 |

* cited by examiner

*Primary Examiner* — Matthew W Such
(74) *Attorney, Agent, or Firm* — Young & Thompson (57) ABSTRACT

A semiconductor device with an elevated source/drain structure provided in each predetermined position defined by the oxide film and gate wiring on a semiconductor silicon substrate, where an orthographic projection image of a shape of an upper end portion of the elevated source/drain structure on the semiconductor silicon substrate along the direction normal to the semiconductor silicon substrate is substantially in agreement with a predetermined shape defined by the corresponding oxide film and gate wiring on the semiconductor silicon substrate, and at least one of orthographic projection images of cross-sections taken along planes parallel with the semiconductor silicon substrate of the elevated source/drain structure on the semiconductor silicon substrate along the direction normal to the semiconductor silicon substrate is larger than the predetermined shape defined by the corresponding oxide film and gate wiring on the semiconductor silicon substrate.

3 Claims, 7 Drawing Sheets

SEMICONDUCTOR DEVICE HAVING AN ELEVATED SOURCE/DRAIN STRUCTURE OF VARYING CROSS-SECTION

BACKGROUND OF THE INVENTION

1. Field of the Invention

The present invention relates to a semiconductor device and method of manufacturing the semiconductor device, and more particularly, to a semiconductor device with a structure where source regions, drain regions and the like are elevated on a surface of a semiconductor silicon substrate and a method of manufacturing such a semiconductor device.

2. Description of the related art

With recent year's reduction in size and weight of electric/electronic components, the structure has been made finer in semiconductor devices such as DRAM and the like provided with memory cells. In such semiconductor devices with the finer structure, the effect of electric field is not small on the source region, drain region and the like. For the purpose of reducing the effect of electric field and the like, the semiconductor device such as DRAM and the like with memory cells has adopted an elevated source structure provided on the surface of the semiconductor silicon substrate, an elevated drain structure provided on the surface of the semiconductor silicon substrate, and the like.

The elevated source structure, the elevated drain structure and the like are generally provided on a semiconductor silicon substrate with an impurity diffusion structure called LDD (Lightly Doped Drain), oxide film as an element isolation region called STI (Shallow Trench Isolation) and the like.

Figure 1:
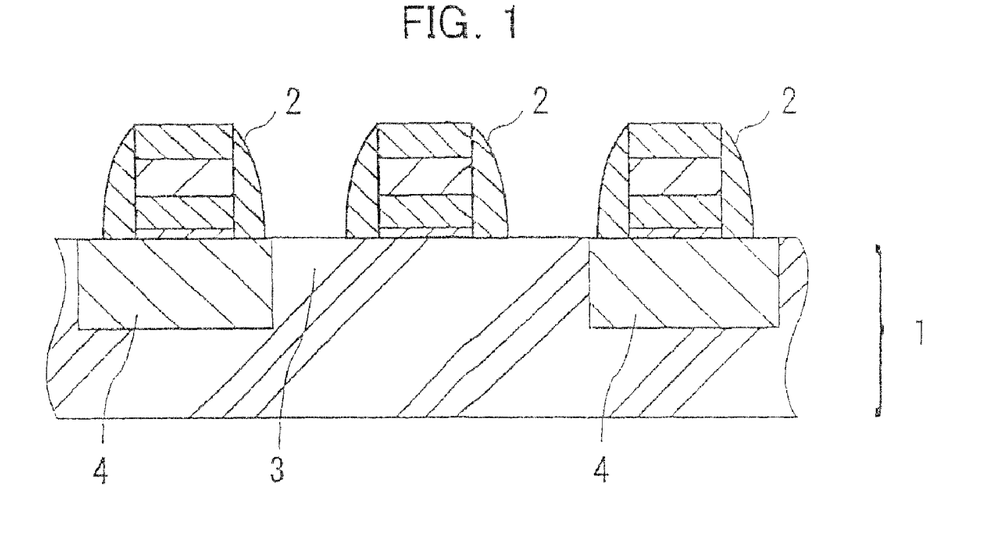
FIG. 1 is a schematic cross-sectional view showing a partial structure of a semiconductor device prior to formation of elevated source/drain structures.

As an example, FIG. 1 shows a partial structure of DRAM prior to formation of the elevated source structure, elevated drain structure and the like.

As shown in FIG. 1, the structure prior to formation of the elevated source structure, elevated drain structure and the like is obtained by removing an unnecessary silicon nitride film by etching operation from a multilayer structure including the semiconductor silicon substrate 1, gate wiring 2 separately provided on the semiconductor silicone substrate 1, the silicon nitride film covering the semiconductor silicon substrate including the gate wiring 2 and the like.

In addition, the semiconductor silicon substrate 1 has an impurity diffusion structure 3 required to operate the DRAM, oxide film 4 and the like provided by well-know means.

Figure 2:
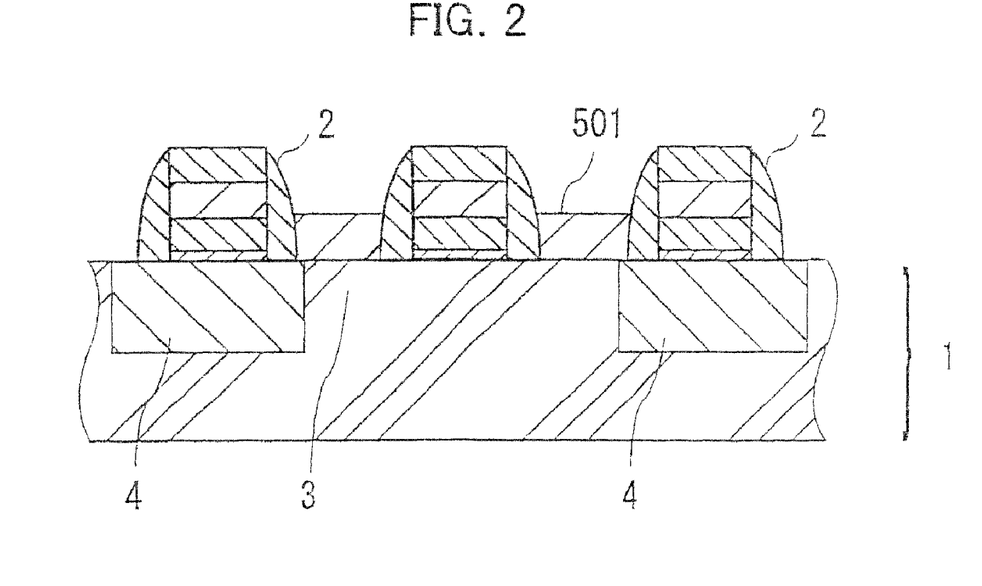
FIG. 2 is a schematic cross-sectional view showing a partial structure of a semiconductor device with ideal elevated source/drain structures provided thereon.

As shown in FIG. 2, it is considered that each elevated structure 501 representing the elevated source structure, elevated drain structure and the like is formed by performing selective epitaxial growth operation on a region formed by the surface of the semiconductor silicon substrate and the side wall of the silicon nitride film of the gate wiring.

However, when the selective epitaxial growth operation is actually performed, such a case sometimes occurs that the elevated structure 501 is not obtained that indicates the ideal elevated source structure, elevated drain structure and the like as shown in FIG. 2, and an inclined plane occurs called a facet that has the plane direction of (111) or (311) in an end portion of STI provided on the semiconductor silicon substrate. Explaining with an example in FIG. 3, an inclined portion 6 in FIG. 3 corresponds to the facet.

An occurrence of such a facet results in a following problem.

Figure 3:
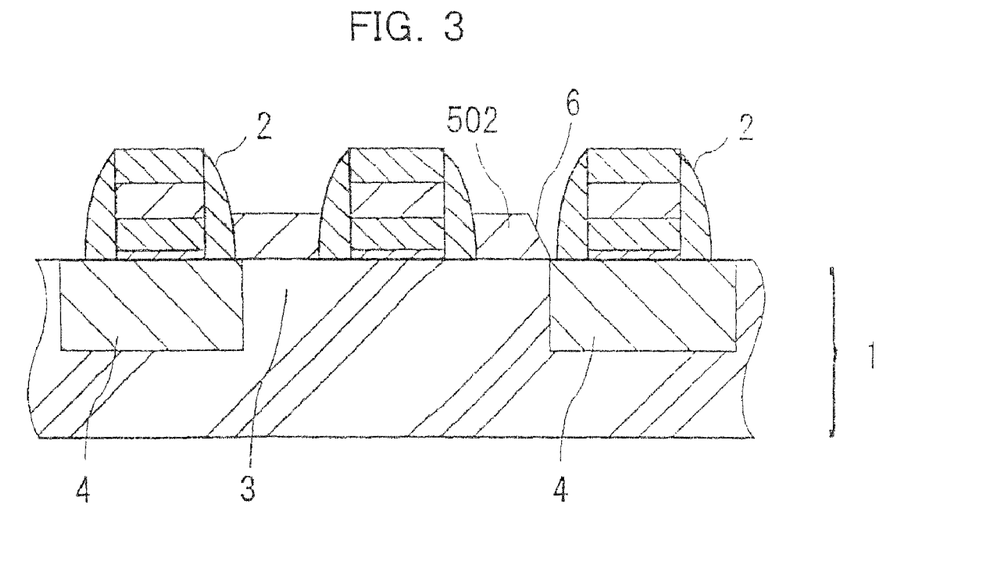
FIG. 3 is a schematic cross-sectional view showing a partial structure of a semiconductor device with a facet occurring in the elevated source/drain structure.

In other words, in performing operation such as implantation of various ions and the like on the semiconductor silicon substrate 1 from above the substrate as viewed in FIG. 3, the distribution of the ions in depth direction such that the ions reach varies between a portion with no facet generated and another portion with the facet generated, and therefore, it is difficult to control implantation of various ions in the semiconductor silicon substrate.

Figure 4:
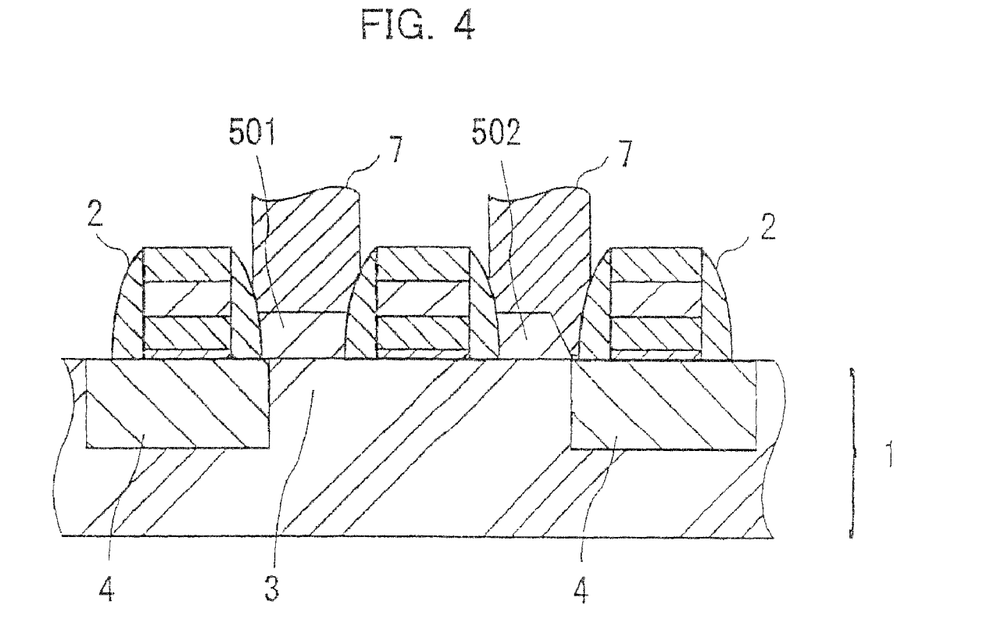
FIG. 4 is a schematic cross-sectional view showing a partial structure of a semiconductor device with a contact formed in the elevated source/drain structure with the facet occurring.

FIG. 4 schematically shows a state where contacts 7 are respectively provided on the elevated structures 501 and 502 representing the elevated source structure, elevated drain structure and the like. In addition, in FIG. 4, an oxide film not shown is provided around the contacts 7.

As shown in FIG. 4, when the elevated structures 501 and 502 are formed and then the contacts 7 of tungsten or the like are provided on the elevated structures, the area of contact between the elevated structure and contact 7 varies for each of the contacts, and a case arises the resistance of the contact differs from one another.

Further, in addition to variations in the contact area, the distance from the bottom of the contact 7 to the semiconductor silicon substrate 1 fluctuates for each of the contacts 7, and due to the fluctuations, another fluctuations may occur in the effect of impurities leaking from the contact on the semiconductor silicon substrate.

There has been a problem that performance of the finally obtained semiconductor device is not stable due to the factors resulting from the facet.

Since the problem arises due to the occurrence of the facet, it is proposed forming the side wall of the gate wiring with two types of oxide films while devising the shape to suppress the occurrence of the facet (see JP 2000-49348).

BRIEF SUMMARY OF THE INVENTION

However, in the means for suppressing the occurrence of the facet by the shape of the side wall of the gate wiring and the like, the means becomes more complicated as the structure of the semiconductor device is made finer. Further, there is a problem that when the facet actually occurs, the means cannot cope with failure based on the generated facet.

It is an object of the present invention to provide a semiconductor device exhibiting stable performance even when the facet occurs and a method of manufacturing such a semiconductor device.

In other words, the invention provides:

[1] a semiconductor device comprising:

(1) an oxide film provided in a predetermined position on a semiconductor silicon substrate;

(2) gate wiring provided on the semiconductor silicon substrate; and (3) at least one structure (hereinafter, referred to as an "elevated source/drain structure") selected from the group consisting of an elevated source structure that is provided in a predetermined position defined by the oxide film and the gate wiring on the semiconductor silicon substrate and that is brought into contact with a side wall of the gate wiring and an elevated drain structure that is provided in a predetermined position defined by the oxide film and the gate wiring on the semiconductor silicon substrate and that is brought into contact with a side wall of the gate wiring, where an orthographic projection image of a shape of an upper end portion of the elevated source/drain structure on the semiconductor silicon substrate along the direction normal to the semiconductor silicon substrate is substantially in agreement with a predetermined shape defined by the oxide film and the gate wiring on the semiconductor silicon substrate, and at least one of orthographic projection images of cross-sections taken along planes parallel with the semiconductor silicon substrate of the elevated source/drain structure on the semiconductor silicon substrate along the direction normal to the semiconductor silicon substrate is larger than the predetermined shape defined by the oxide film and the gate wiring on the semiconductor silicon substrate.

Further, the invention provides:

[2] the semiconductor device as described in above item [1], where the semiconductor silicon substrate has at least an impurity diffusion structure, the oxide film is a silicon oxide film, the side wall of the gate wiring is comprised of a silicon nitride film, and the semiconductor device is dynamic random access memory.

Furthermore, the invention provides:

[3] a method of manufacturing a semiconductor device, comprising the steps of:

(1) providing an impurity diffusion structure and an element isolation region in a semiconductor silicon substrate;

(2) providing gate wiring on the semiconductor silicon substrate; and (3) growing a semiconductor crystal to protrude in contact with a side wall of the gate wiring on the semiconductor silicon substrate by a selective epitaxial growth method, where the step of growing the semiconductor crystal to protrude is performed on at least one condition selected from the group consisting of temperature conditions with two or more levels and pressure conditions with two or more levels.

Still furthermore, the invention provides:

[4] the method of manufacturing a semiconductor device as described in above item [3], where at least one condition selected from the group consisting of temperature conditions with two or more levels and pressure conditions with two or more levels is at least one selected from the group consisting of following items (a) to (c):

(a) under a pressure with a constant value in the range of 1 to 100 Torr, a first temperature condition ranges from 830 to 900° C., and a second temperature condition ranges from 780 to 820° C.;

(b) under a temperature with a constant value in the range of 780 to 900° C., a first pressure condition ranges from 1 to 10 Torr, and a second pressure condition ranges from 20 to 100 Torr; and (c) first conditions of temperature and pressure are respectively in the range of 830 to 900° C. and in the range of 1 to 10 Torr, and second conditions of temperature and pressure are respectively in the range of 780 to 820° C. and in the range of 20 to 100 Torr.

Moreover, the invention provides:

[5] the method of manufacturing a semiconductor device as descried in above item [3] or [4], where a gas for use in the selective epitaxial growth method is a mixed gas of $SiH_2Cl_2$ and HCl.

Figure 8:
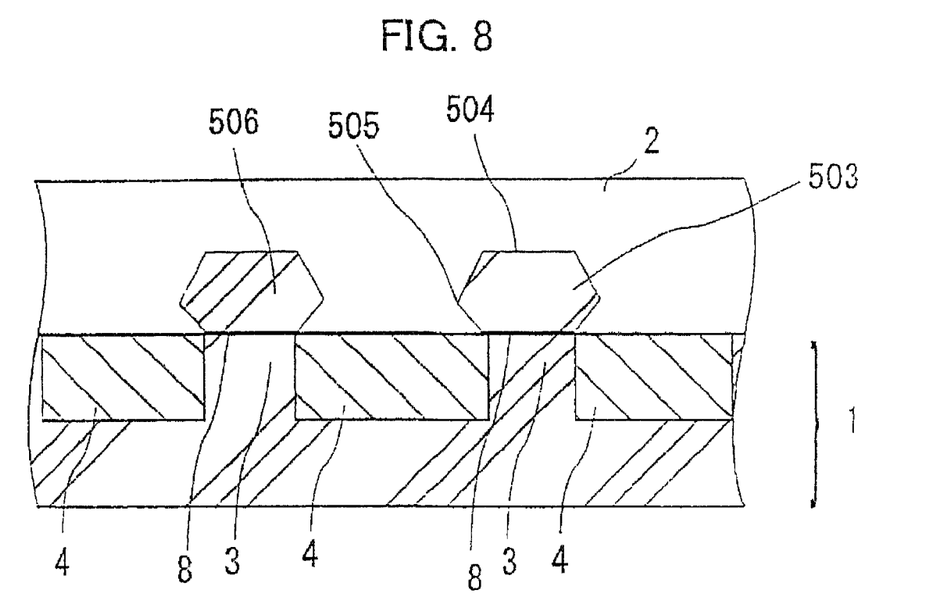
FIG. 8 is a schematic cross-sectional view of principal part showing a cross-section of the elevated source/drain structures obtained by performing a selective epitaxial growth method on the semiconductor silicon substrate defined by the oxide film and gate wiring as shown in FIG. 6.

According to the invention, for example, as shown in FIG. 8, it is possible to provide a semiconductor device provided with the elevated source/drain structures as exemplified by elevated source/drain structures 503 and 506 each having a shape 504 of the upper end portion substantially in agreement with a shape of a portion 8 defined by the oxide film and gate wiring. It is thereby possible to provide the semiconductor device exhibiting stable performance.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE INVENTION

Preferred embodiments of the present invention will specifically be described below with reference to accompanying drawings.

Figure 5:
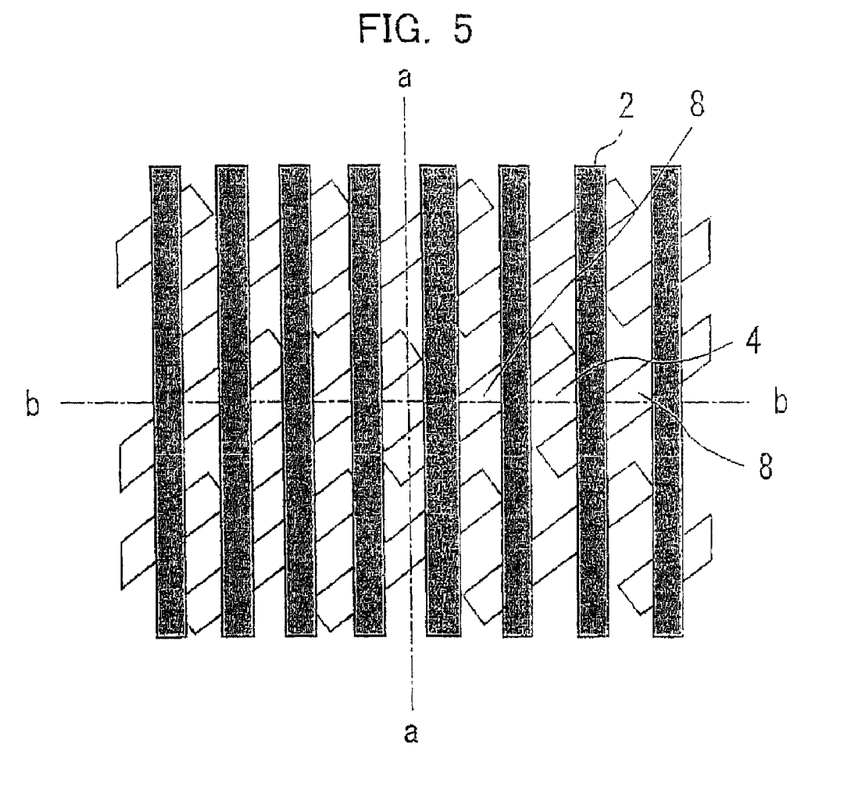
FIG. 5 is a plan view of principal part of the partial structure of the semiconductor device prior to formation of elevated source/drain structures, as viewed from above a semiconductor silicon substrate.

FIG. 5 is a plan view of principal part of a structure prior to formation of elevated source/drain structures, as viewed from above the semiconductor silicon substrate.

In FIG. 5, black lines represent gate wiring 2, rectangle portions shown under the gate wiring 2 represent exposed portions 8 of the surface of the semiconductor silicon substrate, and the other portions represent an oxide film 4 of STI or the like except the gate wiring 2 and exposed portions 8 of the surface of the semiconductor silicon substrate.

Although FIG. 5 shows the case where the gate wiring 2 is slanted off the exposed portions 8 of the surface of the semiconductor silicon substrate, as well as the case with the aspect as shown in FIG. 5, the angle can be set arbitrarily which the gate wiring 2 forms with the exposed portions 8 of the surface of the semiconductor silicon substrate.

The semiconductor silicon substrate for use in the invention is not limited particularly, and it is possible to use silicon substrates generally used for semiconductors. Such semiconductor silicon substrates are well-known and commercially available.

The semiconductor silicon substrate for use in the invention needs to have an oxide film in a predetermined position.

Figure 6:
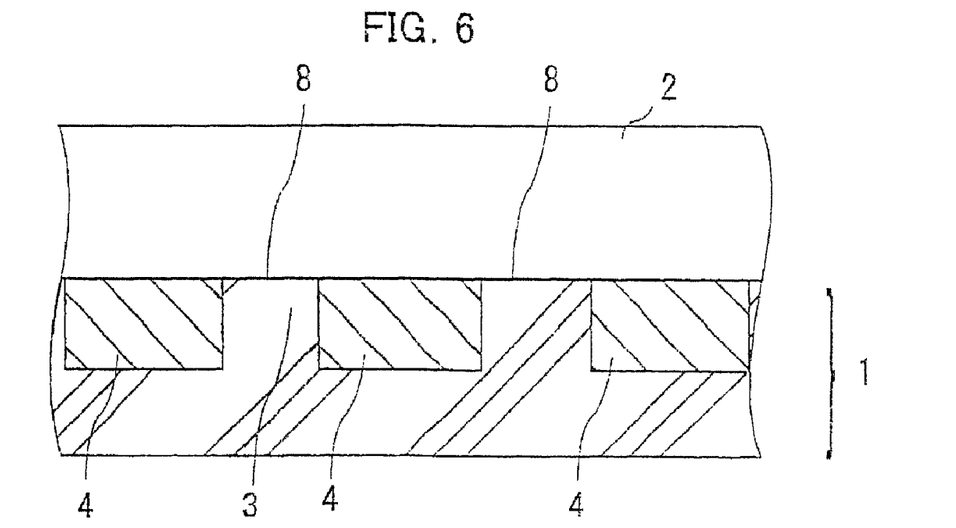
FIG. 6 is a schematic cross-sectional view of principal part showing a cross-section taken along the alternate long and short dashed lines a-a of FIG. 5.

FIG. 6 schematically shows a cross-section taken along the alternate long and short dashed lines a-a of FIG. 5.

As illustrated in FIG. 6, the semiconductor silicon substrate is provided with the impurity diffusion structure 3 such as LDD or the like, the oxide film 4 such as STI or the like, and so on.

Specific examples of the oxide film include silicon oxide and the like.

The gate wiring needs to be provided on the semiconductor silicon substrate for use in the invention.

Figure 7:
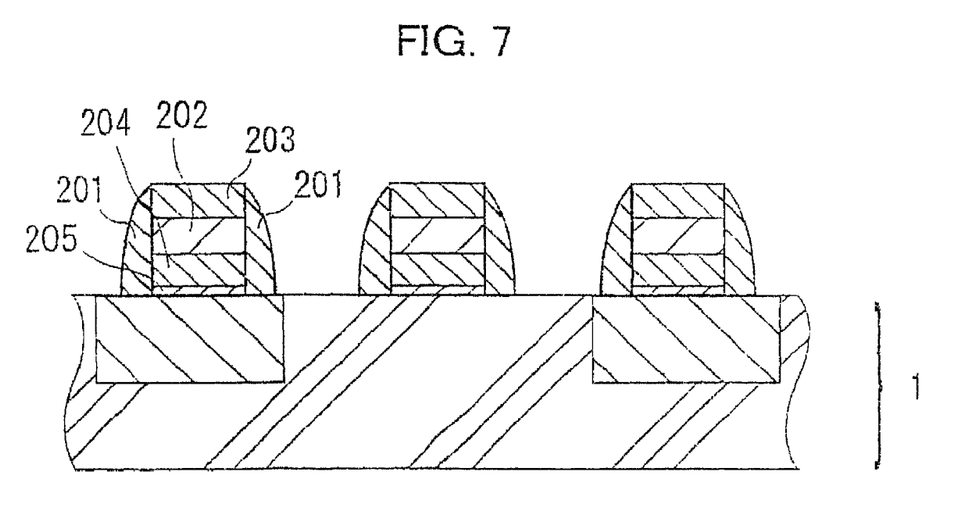
FIG. 7 is a schematic cross-sectional view of principal part showing a cross-section taken along the alternate long and short dashed lines b-b of FIG. 5.

FIG. 7 schematically shows a cross-section taken along the alternate long and short dashed lines b-b of FIG. 5.

As illustrated in FIG. 7, the gate wiring for use in the invention is comprised of a gate electrode made of polycrystal semiconductor 204 and metal, or a gate electrode made of polycrystal semiconductor 204 and metal silicide 202, side wall 201, gate oxide film 205, contact (not shown) and the like.

The gate wiring in the invention is insulated by an insulating film, and examples of the insulating film include silicon nitride and the like.

In the gate wiring as shown in FIG. 7, the insulating film such as silicon nitride or the like is provided on the side wall 201 and an upper structure 203.

A semiconductor device of the invention needs to have the elevated source/drain structure on the semiconductor silicon substrate.

The upper surface portion 8 of the LDD 3 in FIG. 6 is not particularly provided with a protection film or the like, and thus, part of the surface of the semiconductor silicon substrate 1 is exposed.

As illustrated in FIG. 8, the elevated source/drain structure for use in the semiconductor device of the invention is obtained by performing the selective epitaxial growth operation on the upper surface portions 8 of the LDD as shown in FIG. 6.

The upper surface portion 8 of the LDD 3 corresponds to the predetermined position defined by the oxide film 4 and gate wiring 2 on the semiconductor silicon substrate, as illustrated in FIG. 5.

As illustrated in FIG. 8 an orthographic projection image of the shape 504 of the upper end portion of the elevated source/drain structure 503 for use in the invention on the semiconductor silicon substrate along the direction normal to the semiconductor silicon substrate is substantially in agreement with a predetermined shape defined by a corresponding oxide film and gate wiring on the semiconductor silicon substrate.

Explaining with the case of FIG. 5, the predetermined shape indicates a shape of the region shown by "8" surrounded by the oxide film 4 and gate wiring 2.

The source/drain structure 506 is the same as in the foregoing.

By this means, it is possible to provide semiconductors exhibiting stable performance even when the facet occurs in manufacturing the elevated source/drain structure.

In the invention, in the elevated source/drain structure, at least one of orthographic projection images of cross-sections taken along planes parallel with the semiconductor silicon substrate 1 on the semiconductor silicon substrate along the direction normal to the semiconductor silicon substrate is larger than the predetermined shape defined by the corresponding oxide film and gate wiring on the semiconductor silicon substrate.

As illustrated in FIG. 8, by providing a structure 505 extending outward in a middle portion of the elevated source/drain structure 503, it is possible to obtain the elevated source/drain structure 503 having the upper end portion with the predetermined shape 504 with ease, and thereby provide semiconductors exhibiting stable performance.

A method of manufacturing a semiconductor device of the invention will be described below.

The method of manufacturing a semiconductor device of the invention needs to include step (1) of providing an impurity diffusion structure and an element isolation region in the semiconductor silicon substrate.

The semiconductor silicon substrate for use in the manufacturing method of the invention is not limited particularly, and it is possible to use silicon substrates generally used for semiconductors. Such semiconductor silicon substrates are well-known and commercially available.

Step (1) of providing an impurity diffusion structure and an element isolation region is not limited particularly, as long as the method is performed by pretreatment process generally performed using the semiconductor silicon substrate.

As the step of providing an impurity diffusion structure in the semiconductor silicon substrate, specific examples thereof are steps of CVD (Chemical Vapor Deposition), ion implantation and the like. It is possible to perform a single step or combined two or more steps among these steps.

Further, the step of providing an element isolation region in the semiconductor silicon substrate is performed on a semiconductor wafer, and examples of such a step include steps of washing, oxidation, photolithography, dry etching, CMP and the like. It is possible to perform a single step or combined two or more steps among these steps.

Furthermore, the method of manufacturing a semiconductor device of the invention needs to include step (2) of providing gate wiring on the semiconductor silicon substrate.

The gate wiring is comprised of word lines, and can be manufactured according to a generally performed method.

The gate wiring for use in the invention is insulated by insulating film. In terms of property, a material of the insulating film is preferably silicon nitride.

Further, the method of manufacturing a semiconductor device of the invention needs to include step (3) of growing a semiconductor crystal to be elevated in contact with the gate wiring on the semiconductor silicon substrate by a selective epitaxial growth method.

The step of growing a semiconductor crystal to be elevated is performed by the selective epitaxial growth method. As the selective epitaxial growth method, examples thereof are a method of acting a gas component to grow the semiconductor crystal and another gas component to etch the semiconductor crystal simultaneously on the semiconductor silicon substrate, and the like.

As the gas component to grow the semiconductor crystal, for example, when the semiconductor silicon substrate is manufactured using a silicon wafer, $SiH_4$, $SiH_2Cl_2$ and the like may be used. In terms of handling characteristics, $SiH_2Cl_2$ is preferable as the gas component to grow the semiconductor crystal.

As the gas component to etch the semiconductor crystal, for example, when the semiconductor silicon substrate is manufactured using a silicon wafer, examples thereof are halogen contained compounds such as HF, HCl and the like. In terms of handling characteristics, HCl is preferable as the gas component to etch the semiconductor crystal.

As a ratio by volume between the gas components to act on the semiconductor silicon substrate, a ratio of the gas component to grow the semiconductor crystal to the gas component to etch the semiconductor crystal is preferably in the range of 10:1 to 10:8.

The selective epitaxial growth method needs to be performed on at least one condition selected from the group consisting of temperature conditions with two or more levels and pressure conditions with two or more levels.

For the selective epitaxial growth method, as at least one condition selected from the group consisting of temperature conditions with two or more levels and pressure conditions with two or more levels, specific conditions are as described below, for example.

(a) A case where with the pressure set at a constant value in the range of 1 to 100 Torr, a first temperature condition is to perform the selective epitaxial growth method in the range from 830 to 900° C., and a second temperature condition is to perform the selective epitaxial growth method in the range of 780 to 820° C.;

(b) A case where with the temperature set at a constant value in the range of 780 to 900° C., a first pressure condition is to perform the selective epitaxial growth method in the range from 1 to 10 Torr, and a second pressure condition is to perform the selective epitaxial growth method in range from 20 to 100 Torr; and (c) A case that where first conditions of temperature and pressure are to perform the selective epitaxial growth method respectively in the range from 830 to 900° C. and in the range from 1 to 10 Torr, and second conditions of temperature and pressure are to perform the selective epitaxial growth method respectively in the range from 780 to 820° C. and in the range from 20 to 100 Torr.

It is possible to use a single condition or combined two or more conditions among conditions of (a) to (c) and the like.

As indicated in the first temperature condition described in the above-mentioned item (a) or (c), by performing the selective epitaxial growth method first in the range from 830 to 900° C., it is possible to implement selective epitaxial growth mainly in the vertical direction.

Further, as indicated in the first pressure condition described in the above-mentioned item (b) or (c), by performing the selective epitaxial growth method first in the range from 1 to 10 Torr, it is possible to implement selective epitaxial growth mainly in the vertical direction.

Furthermore, as indicated in the second temperature condition described in the above-mentioned item (a) or (c), by performing the selective epitaxial growth method in the range from 780 to 820° C., it is possible to implement selective epitaxial growth mainly in the horizontal direction.

Still furthermore, as indicated in the second pressure condition described in the above-mentioned item (b) or (c), by performing the selective epitaxial growth method in the range from 20 to 100 Torr, it is possible to implement selective epitaxial growth mainly in the horizontal direction.

It is preferable in the above-mentioned item (a) that the pressure ranges from 5 to 30 Torr, the first temperature condition is in the range from 840 to 870° C., and that the second temperature condition is in the range from 790 to 810° C.

It is preferable in the above-mentioned item (b) that the temperature ranges from 800 to 870° C., the first pressure condition is in the range from 3 to 8 Torr, and the second pressure condition is in the range from 25 to 30 Torr.

It is preferable in the above-mentioned item (c) that the first conditions of temperature and pressure are to perform the selective epitaxial growth method respectively in the range from 840 to 870° C. and in the range from 3 to 8 Torr, and the second conditions of temperature and pressure are to perform the selective epitaxial growth method respectively in the range from 790 to 810° C. and in the range from 25 to 30 Torr.

According to this method, as illustrated in FIG. 8, it is possible to manufacture the elevated source/drain structure such that the shape of the upper surface portion 8 of the LDD 3 is substantially in agreement with the shape 504 of the upper end portion of the elevated source/drain structure 503.

The elevated source/drain structure 506 is the same as in the foregoing.

The semiconductor silicon substrate provided with thus obtained elevated source/drain structures undergoes as appropriate well-known processing such as a wafer processing process, wiring process, assembling process and the like, and can be formed into a semiconductor device such as, for example, DRAM (Dynamic Random Access Memory) and the like.

A semiconductor device of the invention is obtained by this manufacturing method.

The present invention will more specifically be described below with reference to Examples, but is not limited to the Examples.

EXAMPLE 1

Figure 9:
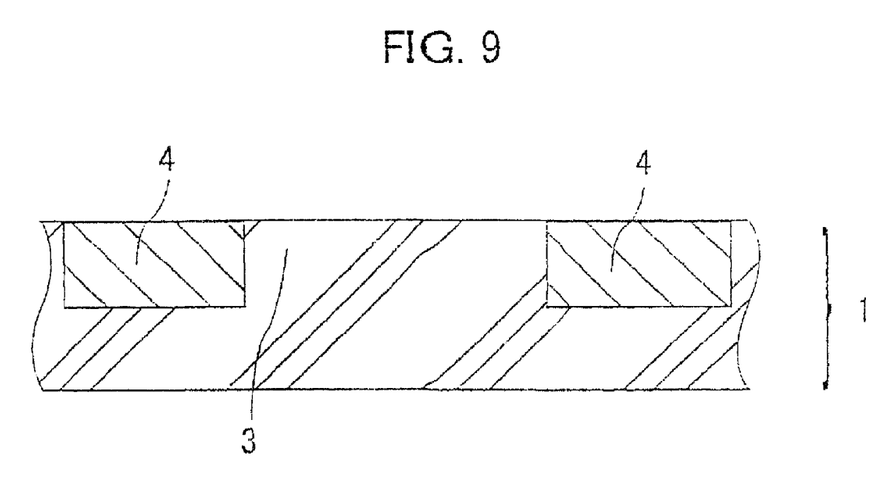
FIG. 9 is a schematic cross-sectional view of principal part of a semiconductor silicon substrate provided with an impurity diffusion structure and oxide film (Example 1)

As illustrated in FIG. 9, LDD that is the impurity diffusion structure 3 and STI that is the oxide film 4 were provided in a semiconductor silicon substrate 1.

A basic structure of the gate wring was provided on the silicon wafer, and the entire gate wiring was covered with silicon nitride.

Figure 10:
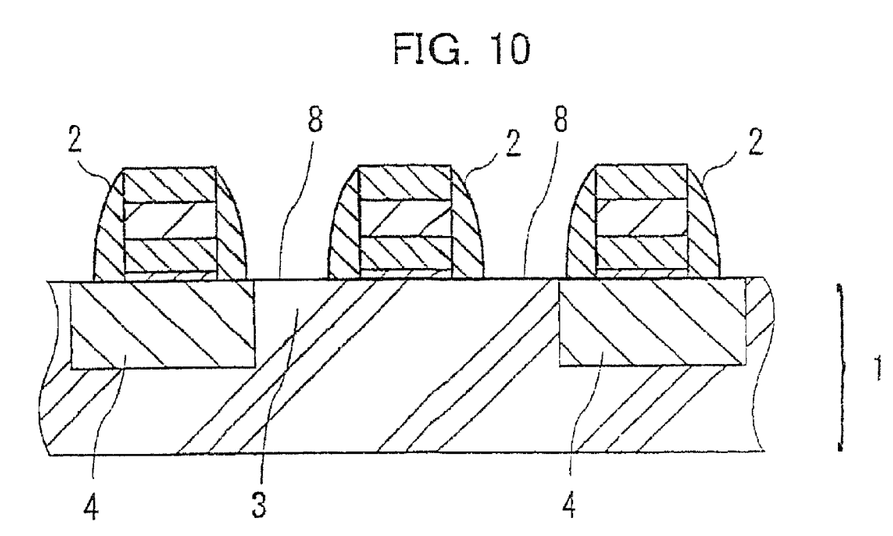
FIG. 10 is a schematic cross-sectional view of principal part of the semiconductor silicon substrate provided with gate wiring, taken along the direction perpendicular to the gate wiring (Example 1)

Then, as shown in FIG. 10, unnecessary part of the silicon nitride was removed by etching, and the gate wiring 2 was formed on the semiconductor silicon substrate 1. In addition, FIG. 10 schematically shows a cross-section taken along the direction perpendicular to the wiring direction of the gate wiring 2.

Figure 11:
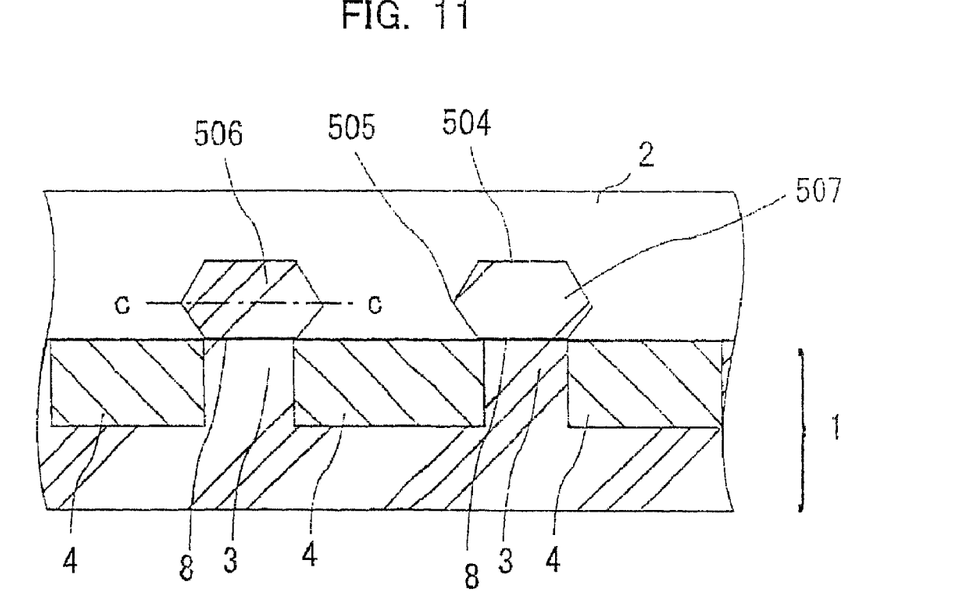
FIG. 11 is a cross-sectional view of principal part of the semiconductor silicon substrate showing elevated source/drain structures (Examples 1 and 2)

Next, the selective epitaxial growth method was performed on the exposed portions 8 of surface of the semiconductor silicon substrate as shown in FIG. 10, and the elevated source structure 506 and drain protrusion structure 507 were formed on the exposed portions 8 of the surface of the semiconductor silicon substrate as shown in FIG. 11.

In addition, each exposed portion 8 of the surface of the silicon wafer as shown in FIG. 10 is defined by the oxide film 4 and the gate wiring 2 on the silicon wafer.

The selective epitaxial growth method was performed on following conditions. In other words, as the first step, on conditions of the temperature of 850° C. and pressure of 15 Torr, selective epitaxial growth was performed on the exposed portions 8 of the surface of the semiconductor silicon substrate 1 using $SiH_2Cl_2$ with a flow rate of 200 ml/minute and HCl with a flow rate of 120 ml/minute. By the operation of the first step, an elevated structure with a height of 50 nm of silicon was obtained on each portion 8 of the semiconductor silicon substrate.

Then, as the second step, on conditions of the temperature of 800° C. and pressure of 15 Torr, selective epitaxial growth was performed using $SiH_2Cl_2$ with a flow rate of 200 ml/minute and HCl with a flow rate of 80 ml/minute. By the operation of the second step, silicon was further piled by 20 nm on the elevated structure with a height of 50 nm of silicon.

The elevated source structure 506 and drain elevated structure 507 were thus obtained by the first step and second step in the selective epitaxial growth method, and as shown in FIG. 11, had a height of 70 nm and an extension of about 20 to 25 nm in the horizontal direction.

With respect to the shape of the upper end portion of each of the elevated source structure 506 and elevated drain structure 507, an orthographic projection image of such a shape on the semiconductor silicon substrate along the direction normal to the semiconductor silicon substrate was substantially in agreement with the exposed portion 8 of the surface of the semiconductor silicon wafer.

Further, the cross-section taken along the alternate long and short dashed lines c-c of FIG. 11 in this Example was larger than the shape of the exposed portion 8 of the surface of the semiconductor silicon substrate.

DRAM was obtained by performing well-known processing such as the wafer processing process, wiring process, assembling process and the like on thus obtained silicon wafer provided with the elevated source structure 506 and elevated drain structure 507. Characteristics of the obtained DRAM varied small with the products.

EXAMPLE 2

The same operation as in Example 1 was carried out except that the temperature condition and pressure condition in the first step were respectively 850° C. and 5 Torr, and that the temperature condition and pressure condition in the second step were respectively 850° C. and 25 Torr, and as in the case of Example 1, DRAM was obtained that had the elevated source structure 506 and elevated drain structure 507 as shown in FIG. 11. Characteristics of the obtained DRAM varied small with the products.

COMPARATIVE EXAMPLE 1

The same operation as in Example 1 was carried out except that conditions in the first step were the temperature of 850° C., the pressure of 15 Torr, and flow rates of $SiH_2Cl_2$ and HCl respectively of 200 ml/minute and 120 ml/minute and that the operation in the second step was omitted.

Figure 12:
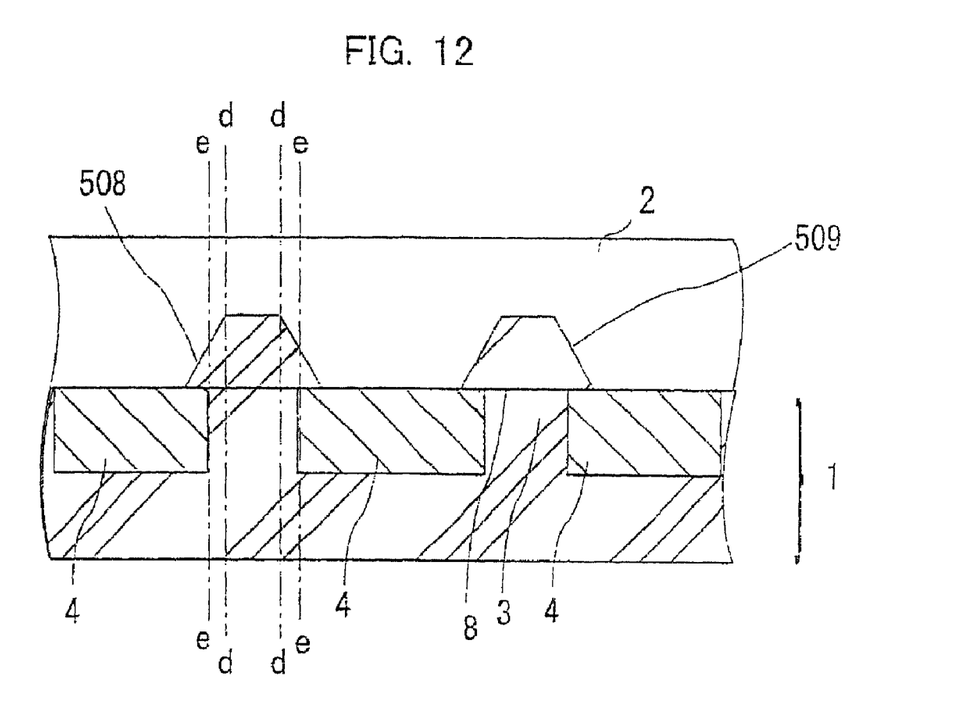
FIG. 12 is a cross-sectional view of principal part of a semiconductor silicon substrate showing elevated source/drain structures (Comparative Example 1)

Obtained DRAM had an elevated source structure 508 and elevated drain structure 509 as shown in FIG. 12.

The distance between the alternate long and short dashed lines d-d is narrower than the distance between the alternate long and short dashed lines e-e in FIG. 12.

Characteristics of the obtained DRAM varied greatly with the products.

COMPARATIVE EXAMPLE 2

The same operation as in Example 1 was carried out except that conditions in the first step were the temperature of 800° C., the pressure of 15 Torr, and flow rates of $SiH_2Cl_2$ and HCl respectively of 200 ml/minute and 80 ml/minute and that the operation in the second step was omitted.

Figure 13:
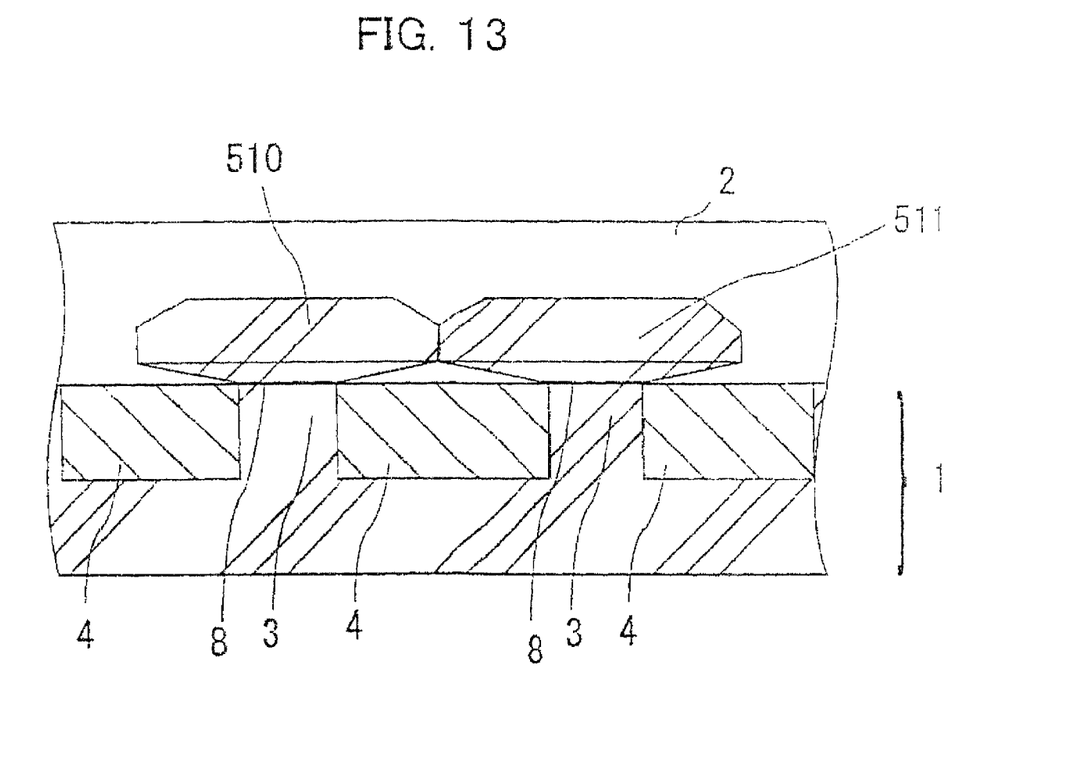
FIG. 13 is a cross-sectional view of principal part of a semiconductor silicon substrate showing elevated source/drain structures (Comparative Example 2).

Obtained DRAM had an elevated source structure 510 and elevated drain structure 511 as shown in FIG. 13, but unstable performance were observed because the elevated structures contacted each other beyond the oxide film 4 as shown in FIG. 13.

The present invention is not limited to the above described embodiments, and various variations and modifications may be possible without departing from the scope of the present invention.

This application is based on the Japanese Patent application No. 2005-125921 filed on Apr. 25, 2005, entire content of which is expressly incorporated by reference herein.

What is claimed is:

1. A semiconductor device comprising:
   an isolation region selectively formed in a semiconductor substrate,
   a gate wiring structure selectively formed on the semiconductor substrate, the semiconductor substrate thereby having first and second surface portions defined by the isolation region and the gate wiring structure, each of the first and second surface portions including a plurality of side edges, at least one of the side edges being defined by the gate wiring structure and the remaining ones of the side edges being defined by the isolation region; and
   elevated source and drain regions formed respectively on the first and second surface portions, each of the elevated source and drain regions including a lower surface which is in contact with an associated one of the first and second surface portions with the same shape as the associated one of the first and second surface portions and an upper surface which is substantially the same as the lower surface and aligned with the lower surface, each of the elevated source and drain regions further including a side surface which protrudes from an associated one of the remaining ones of the side edges of a corresponding one of the first and second surface portions on a slant in a direction of the isolation region without substantially contacting with the isolation region, followed by slanting in an opposite direction to the isolation region to terminate the upper surface, wherein a cross-sectional area of each elevated source and drain region in any plane parallel to the substrate is greater than the area of the upper or lower surfaces thereof.

2. The semiconductor device according to claim 1, wherein the isolation region comprises an STI structure.

3. The semiconductor device according to claim 1, wherein the gate wiring structure comprises a gate insulating film formed on the semiconductor substrate between the first and second portions, a gate electrode formed on the gate insulating film and side walls formed on side surfaces of the gate insulating film and the gate electrode.

* * * * *